United States Patent
Shin

(10) Patent No.: US 9,553,213 B2
(45) Date of Patent: Jan. 24, 2017

(54) SOLAR CELL APPARATUS AND METHOD OF FABRICATING THE SAME

(71) Applicant: LG INNOTEK CO., LTD., Seoul (KR)

(72) Inventor: Min Jung Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 293 days.

(21) Appl. No.: 14/352,797

(22) PCT Filed: Oct. 17, 2012

(86) PCT No.: PCT/KR2012/008480
§ 371 (c)(1),
(2) Date: Apr. 18, 2014

(87) PCT Pub. No.: WO2013/058540
PCT Pub. Date: Apr. 25, 2013

(65) Prior Publication Data
US 2014/0238472 A1    Aug. 28, 2014

(30) Foreign Application Priority Data
Oct. 18, 2011  (KR) .................. 10-2011-0106371

(51) Int. Cl.
H01L 31/046  (2014.01)
H01L 31/02  (2006.01)
H01L 27/30  (2006.01)

(52) U.S. Cl.
CPC ......... *H01L 31/0201* (2013.01); *H01L 27/302* (2013.01); *H01L 31/046* (2014.12); *Y02E 10/542* (2013.01)

(58) Field of Classification Search
CPC .................................................... H01L 31/046
See application file for complete search history.

(56) References Cited

U.S. PATENT DOCUMENTS 5,527,735 A     6/1996   Tomikawa et al.
6,300,556 B1 * 10/2001  Yamagishi ............ H01L 31/048
                                                             136/251
(Continued)

FOREIGN PATENT DOCUMENTS

CN      101918604 A    12/2010
CN      101980368 A     2/2011
(Continued)

OTHER PUBLICATIONS

Office Action dated Sep. 6, 2015 in Chinese Application No. 201280062756.8.
(Continued)

*Primary Examiner* — Magali P Slawski
(74) *Attorney, Agent, or Firm* — Saliwanchik Lloyd & Eisenschenk

(57) ABSTRACT

Disclosed are a solar cell apparatus, and a method of fabricating the same. The solar cell apparatus includes: dummy parts disposed on a support substrate; a plurality of solar cells disposed on the support substrate and disposed between the dummy parts; and a bus bar electrically connected to the solar cells and disposed between the support substrate and the dummy parts. Each of the solar cells and the dummy parts has a back electrode layer, a light absorbing layer, and a front electrode layer sequentially disposed on the support substrate.

8 Claims, 2 Drawing Sheets

(56) References Cited

U.S. PATENT DOCUMENTS

| | | | |
|---|---|---|---|
| 8,642,881 B2* | 2/2014 | Lee | H01L 31/02242 136/252 |
| 8,742,247 B2* | 6/2014 | Kang | H01L 31/1804 136/244 |
| 2010/0218820 A1* | 9/2010 | Kim | H01L 31/02242 136/256 |
| 2010/0269907 A1 | 10/2010 | Lackner et al. | |
| 2012/0017969 A1* | 1/2012 | Yuuya | H01L 31/0392 136/244 |
| 2013/0008496 A1 | 1/2013 | Jee | |

FOREIGN PATENT DOCUMENTS

| | | |
|---|---|---|
| CN | 102214708 A | 10/2011 |
| EP | 0650201 A1 | 4/1995 |
| JP | 2759301 B2 | 5/1998 |
| KR | 10-2010-0138299 A | 12/2010 |
| KR | 10-2011-0100489 A | 9/2011 |
| WO | WO-2011/119001 A2 | 9/2011 |

OTHER PUBLICATIONS

International Search Report in International Application No. PCT/KR2012/008480, filed Oct. 17, 2012.

\* cited by examiner

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/008480, filed Oct. 17, 2012, which claims priority to Korean Application No. 10-2011-0106371, filed Oct. 18, 2011, the disclosures of each of which are incorporated herein by reference in their entirety.

TECHNICAL FIELD

The embodiment relates a solar cell apparatus and a method of fabricating the same.

BACKGROUND ART

A solar cell may be defined as a device for converting light energy into electric energy by using a photovoltaic effect where electrons are produced by exposing a p-n junction diode to light. Such solar cells may be classified into a silicon solar cell, a compound semiconductor solar cell, a dye-sensitized solar cell, and an organic solar cell according to a material used as a junction diode.

A minimum unit of a solar cell is a cell, and a voltage produced by one solar cell is generally as low as approximately 0.5 V to 0.6 V. A unit fabricated in the form of a panel where several solar cells are connected to each other in series on a substrate to produce a voltage of several volts or several hundred volts is referred to as a module, and a solar cell apparatus is fabricated by installing the solar cell module on a frame.

In the solar cell apparatus, conductors (bus bars) serving as a positive electrode and a negative electrode are connected to the solar cells. In a general bus bar fabricating process, after a solar cell module is fabricated, a metal bus bar is formed on a solar cell module through a process such as soldering. Next, a bonding member having a color similar to that of an external panel is disposed on the bus bar to improve an outer appearance of the solar cell module.

The bus bar fabricated through the method has a weak bonding strength to the solar cell module, and also requires an additional process for improving an outer appearance of the solar cell module, deteriorating process efficiency.

DISCLOSURE OF INVENTION

Technical Problem

The embodiment provides a solar cell apparatus having improved photoelectric conversion efficiency and outer appearance.

Solution to Problem

According to the embodiment, there is provided a solar cell apparatus including: dummy parts on a support substrate; a plurality of solar cells on the support substrate and between the dummy parts; and a bus bar electrically connected to the solar cells and disposed between the support substrate and the dummy parts, wherein each of the solar cells and the dummy parts has a back electrode layer, a light absorbing layer, and a front electrode layer sequentially disposed on the support substrate.

According to the embodiment, there is provided a method of fabricating a solar cell apparatus, the method including: forming a back electrode layer on a support substrate; forming a bus bar on the back electrode layer; forming a light absorbing layer on the back electrode layer and the bus bar; forming a front electrode layer on the light absorbing layer; and patterning the light absorbing layer and the front electrode layer to form a plurality of solar cells and dummy parts.

Advantageous Effects of Invention

In the solar cell apparatus according to the embodiment, the bus bar is disposed between the support substrate and the dummy. Accordingly, the solar cell apparatus according to the embodiment can prevent exposure of the bus bar to the outside without using a separate shielding unit. Thus, an aesthetic feature of the solar cell apparatus according to the embodiment can be significantly improved, and the solar cell apparatus can be easily applied to a curtain wall solar cell module, for example, used on an outer wall of a building.

In addition, the bus bar is formed in a non-active area (NAA) other than an active area (AA) where the solar cells are formed, for example, in the dummy. Thus, the solar cell apparatus can increase the active area. Accordingly, an efficiency of the solar cell apparatus can be increased.

In the method of fabricating the solar cell apparatus according to the embodiment, the bus bar is formed on the back electrode layer before the light absorbing layer is formed. Thus, a contact resistance layer, which may be generated in the light absorbing layer fabricating process, is not formed on an interfacial surface between the back electrode layer and the bus bar. Accordingly, electron migration may be facilitated between the back electrode layer and the bus bar, and a photoelectric conversion efficiency of the solar cell apparatus can be improved. In addition, a bonding strength between the back electrode layer and the bus bar can be significantly improved.

MODE FOR THE INVENTION

Figure 1:
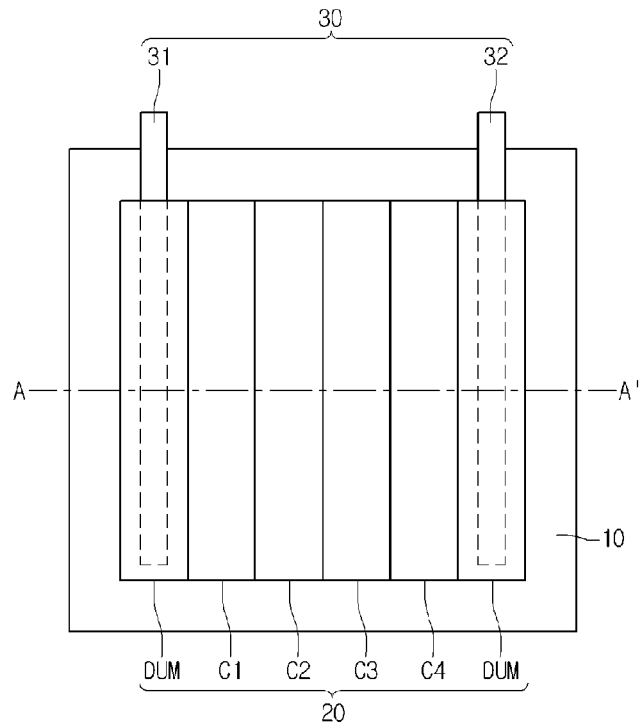
FIG. 1 is a plan view illustrating an upper surface of a solar cell apparatus according to an embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
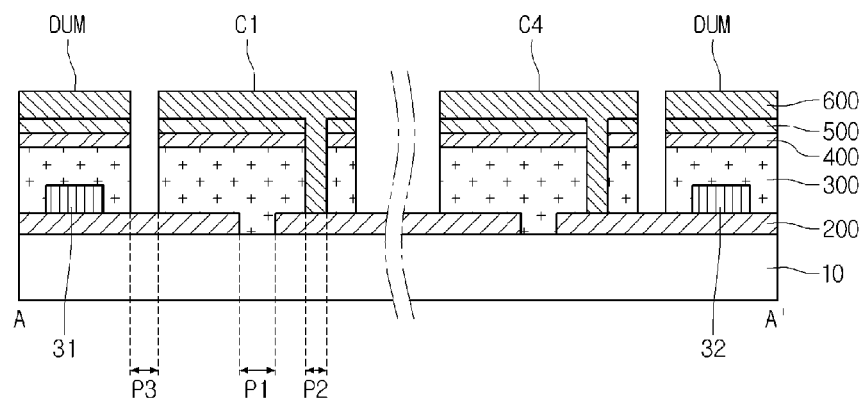
FIGS. 2 and 3 are sectional views taken along line A-A' of FIG. 1.
Figure 3:
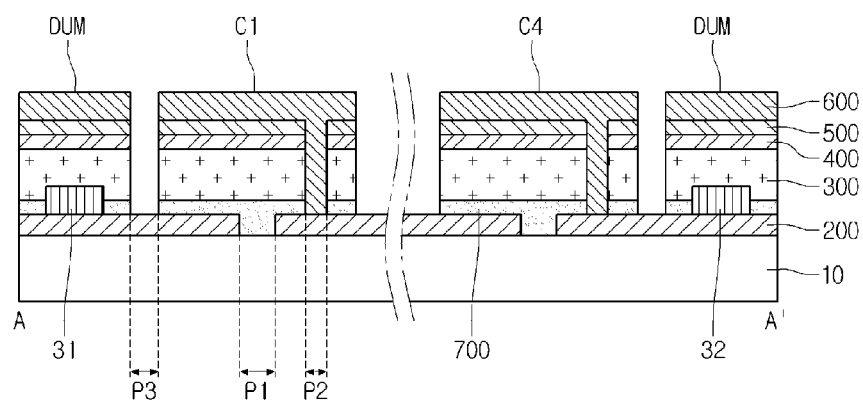

FIG. 1 is a plan view illustrating an upper surface of a solar cell apparatus according to an embodiment. FIGS. 2 and 3 are sectional views taken along line A-A' of FIG. 1.

Referring to FIG. 1, the solar cell apparatus according to the embodiment includes a support substrate 10, a solar cell module 20, and a bus bar 30.

The support plate 10 has a plate shape, and supports the solar cell module 20 and the bus bar 30. The support substrate 10 may be transparent and rigid or flexible. The support body 10 may be an insulator.

For example, the support substrate 10 may be a glass substrate, a plastic substrate, or a metal substrate. In more detail, the substrate 10 may be a soda lime glass substrate.

As an alternative, the material of the support substrate 10 may include ceramics such as alumina, stainless steel, a flexible polymer, or the like.

The solar cell module 20 is disposed on the support substrate 10. The solar cell module 20 may include a plurality of solar cells C1, C2, C3, ... and a dummy DUM.

The solar cells C1, C2, C3, ... are electrically connected to each other. For example, the solar cells C1, C2, C3, ... may be connected to each other in series, but the embodiment is not limited thereto. Accordingly, the solar cell module 20 may convert sunlight into electric energy. Meanwhile, FIGS. 1 to 3 illustrate four solar cells C1, C2, C3, ..., but the embodiment is not limited thereto.

Each of the solar cells C1, C2, C3, ... includes a back electrode layer 200 disposed on the support substrate 10, a light absorbing layer 300 disposed on the back electrode layer 200, and a front electrode layer 600 disposed on the light absorbing layer 300. Each of the solar cells C1, C2, C3, ... may further include a buffer layer 400 and a high-resistance buffer layer 500 between the light absorbing layer 300 and the front electrode layer 600, but the embodiment is not limited thereto.

The back electrode layer 200 may be formed of one of molybdenum (Mo), gold (Au), aluminum (Al), chrome (Cr), tungsten (W), and copper (Cu). Among the above materials, the Mo represents a thermal expansion coefficient similar to that of the support substrate 100, so the Mo may improve the adhesive property and prevent the back electrode layer 200 from being delaminated from the substrate 100.

The light absorbing layer 300 is disposed on the back electrode layer 200. The light absorbing layer 300 includes group I-III-VI compounds. For example, the light absorbing layer 300 may have a copper-indium-gallium-selenium-based (Cu(In,Ga)(Se,S)$_2$; CIGSS-based) crystalline structure, a copper-indium-selenium-based or copper-gallium-selenium-based crystalline structure.

The buffer layer 400 is disposed on the light absorbing layer 300. The buffer layer 400 includes cadmium sulfide, ZnS, In$_x$S$_y$, and In$_x$Se$_y$Zn(O, OH). The high-resistance buffer layer 500 is disposed on the buffer layer 400. The high-resistance buffer layer 500 includes zinc oxide (i-ZnO) which is not doped with impurities.

The front electrode layer 600 may be disposed on the light absorbing layer 300. For example, the front electrode layer 600 may directly make contact with the high-resistance buffer layer 500 on the light absorbing layer 300.

The front electrode layer 600 may be formed of a transmitting conductive material. Further, the front electrode layer 600 may have characteristics of an n-type semiconductor. Then, the front electrode layer 600 may form an n-type semiconductor layer together with the buffer layer 40 to form a pn junction with the light absorbing layer 300 which is a p-type semiconductor layer.

Meanwhile, referring to FIG. 2, the solar cell module 20 according to the embodiment may further include a dummy DUM in addition to the solar cells C1, C2, C3, ..... The dummy DUM refers to a non-active area (NAA) formed in a patterning process to electrically connect the solar cells C1, C2, C3, ... with each other. The dummy DUM may be formed at an outermost part of the solar cell module 20. For example, as illustrated in FIG. 2, the dummy DUM may be formed on both side surfaces of the solar cell module 20.

Similar to the solar cells C1, C2, C3, ..., the dummy DUM may include the back electrode layer 200 or the front electrode layer 600. The description about the solar cells C1, C2, C3, ... may be essentially incorporated in the description for the dummy DUM.

The bus bar 30 is disposed between the support substrate 10 and the dummy DUM. The bus bar 30 may be formed of one of silver (Ag), copper (Cu), gold (Au), aluminum (Al), tin (Sn), titanium (Ti), nickel (Ni), an alloy thereof, and a combination thereof. In more detail, the bus bar 30 may be formed of silver (Ag). For example, a specific resistance of the bus bar 30 may be $3 \times 10^{-6}$ Ωcm to $5 \times 10^{-6}$ Ωcm when a thickness of the bus bar 30 is approximately 5 μm to 15 μm and a width of the bus bar 30 is approximately 1 mm to 4 mm, but the embodiment is not limited thereto.

The bus bar 30 is disposed on the back electrode layer 200 of the solar cell module 20. In more detail, the bus bar 30 may be disposed on the back electrode layer 200 of the dummy DUM. For example, the bus bar 30 may directly make contact with an upper surface of the back electrode layer 200 in the dummy DUM. Accordingly, the light absorbing layer 300 or the front electrode layer 600 is disposed on the bus bar 30.

Thus, the bus bar 30 is prevented from being exposed to the outside even without using a separate shielding unit. Accordingly, an aesthetic feature of the solar cell apparatus according to the embodiment can be significantly improved, and the solar cell apparatus can be easily applied to a curtain wall solar cell module, for example, used on an outer wall of a building. Further, the bus bar 30 is formed in a non-active area (NAA) other than an active area (AA) where the solar cells C1, C2, C3, ... are formed, so the active area is substantially increased. Accordingly, an efficiency of the solar cell apparatus can be increased.

The bus bar 30 may include a first bus bar 31 connected to one of the solar cells C1, C2, C3, ... and a second bus bar 32 connected to another one of the solar cells C1, C2, C3, ..... For example, as illustrated in FIG. 2, the first bus bar 31 may be electrically connected to the cell C1 through the back electrode layer 200. Further, the second bus bar 32 may be electrically connected to the cell C4 through the back electrode layer 200.

The bus bar 30 may be formed at an outer peripheral area of the solar cell module 20. For example, as illustrated in FIG. 2, the bus bar 30 may be formed on both side surfaces of the solar cell module 20.

Referring to FIG. 3, the solar cell apparatus according to the embodiment may further include a contact resistance layer 700. The contact resistance layer 700 is formed on the back electrode layer 200 where the bus bar 30 is not formed, and increases a contact resistance of the back electrode layer 200.

The contact resistance layer 700 may be formed in a process of forming the light absorbing layer 300. For example, the contact resistance layer 700 may be formed by a reaction of the back electrode layer 200 of molybdenum (Mo) and the light absorbing layer 300 of selenium (Se), and may include MoSe$_2$ or MOS$_2$.

As described above, the contact resistance layer is not disposed on an interfacial surface of the bus bar 30 and the back electrode layer 200. Accordingly, the bus bar 30 and the back electrode layer 200 may directly make contact with each other, and electron migration may be facilitated between the bus bar 30 and the back electrode layer 200. Thus, the photoelectric conversion efficiency of the solar cell apparatus according to the embodiment can be improved, and a bonding strength between the bus bar 30 and the back electrode layer 200 can be significantly improved.

FIGS. 4 to 8 are sectional views illustrating a method of fabricating a solar cell apparatus according to an embodiment. The method according to the embodiment will be described with reference to the above-described solar cell apparatus.

Figure 4:
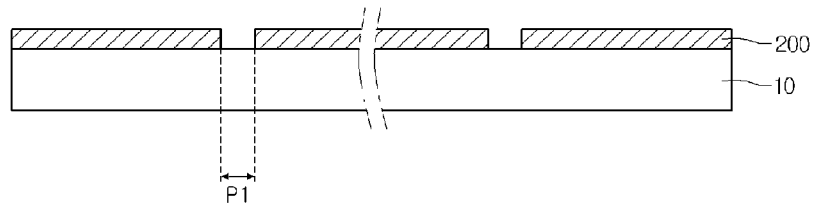
FIGS. 4 to 8 are sectional views illustrating a method of fabricating a solar cell apparatus according to an embodiment.

Referring to FIG. 4, the back electrode layer 200 is formed on the support substrate 10. The back electrode layer 200 may be formed through physical vapor deposition (PVD) or plating.

The back electrode layer 200 includes a first pattern P1. That is, the back electrode layer 200 may be patterned by the first pattern P1. For example, a width of the first pattern P1 is approximately 80 μm to 200 μm, but the embodiment is not limited thereto.

Figure 5:
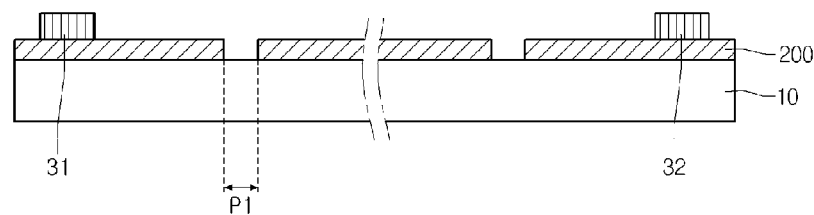

Next, the bus bar 30 is formed on the back electrode layer 200. For example, as illustrated in FIG. 5, the first bus bar 31 and the second bus bar 32 may be formed on the back electrode layer 200.

A process for forming the bus bar 30 is not specifically limited if it is generally used in the art.

As an example, the bus bar 30 may be fabricated by using paste. In more detail, the bus bar 30 may be fabricated by coating a paste composition containing conductive powder including silver (Ag), copper (Cu), gold (Au), aluminum (Al), tin (Sn), titanium (Ti), nickel (Ni), an alloy thereof, and a combination thereof on the back electrode layer 200 and heat-treating the coated paste composition. In more detail, the conductive powder may include a material selected from the group consisting of silver (Ag), a silver (Ag) alloy, a silver (Ag) compound, and a combination thereof. For example, the conductive powder may be silver (Ag) particles having a size of approximately 0.01 μm to 30.0 μm, but the embodiment is not limited thereto.

In addition to the above-described powder, the paste composition includes a binder and a solvent. In addition, the paste composition may include a dispersing medium to improve a dispersing property of the solid components. An example of a material used as the binder may include nitro cellulose, ethyl cellulose, or an acryl resin, but the embodiment is not limited thereto. An example of a material used as the solvent may include alcohol such as ethanol or methanol, but the embodiment is not limited thereto.

The paste composition fabricated through the method may be printed or coated on the back electrode layer 200 through dip coating, screen printing, roll printing, or table coating.

Thereafter, the bus bar 30 may be fabricated by heat-treating the paste composition. The heat treatment process includes processes of drying, preheating, and curing the paste composition. The preheating process may be performed at a temperature of approximately 200° C. to 400° C. and for approximately 10 to 60 minutes, but the embodiment is not limited thereto. Then, an organic material such as the solvent and the binder contained in the paste composition may be removed. Thereafter, the paste composition is cured at a temperature of approximately 450° C. to 600° C., so that the bus bars 31 and 32 may be formed on the back electrode layer 200.

As another example, the bus bar may be fabricated through bonding. In more detail, the bus bar 30 may be fabricated by forming a bus line (not illustrated) on a part of the back electrode layer 200 and bonding the bus bar 30 onto the bus line. Similar to the bus bar 30, the bus line may contain a conductive material including silver (Ag), copper (Cu), gold (Au), aluminum (Al), tin (Sn), titanium (Ti), nickel (Ni), an alloy thereof, and a combination thereof. The bus line may be fabricated through a general soldering process or a laser process. For example, the bus line may be bonded to the back electrode layer 200 through spot welding, but the embodiment is not limited thereto.

Next, the bus bar 30 is electrically connected to the bus line. The bus bar 30 may also be fabricated through a general soldering process or a laser process. Then, in the laser process, the bus line and the bus bar 30 may be bonded to each other by using a laser having a wavelength ranging from 800 nm to 1110 nm. For example, the bus bar 30 may be bonded to the bus line through spot welding, but the embodiment is not limited thereto.

Meanwhile, it has been so far described that the bus line is formed on the back electrode layer 200 and the bus bar 30 is formed on the bus line, but the embodiment is not limited thereto. That is, in the solar cell apparatus according to the embodiment, the bus bar 30 may be directly formed on the back electrode layer 200 through a soldering process or a laser process.

Figure 6:
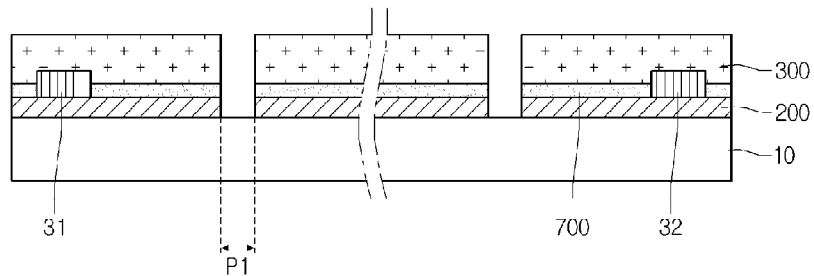

Referring to FIG. 6, the light absorbing layer 300 is formed on the back electrode layer 200 and the bus bar 30. A representative example of forming the light absorbing layer 300 includes, for example, a method of forming a copper-indium-gallium-selenium-based $(Cu(In,Ga)(Se)_2$; CIGS-based) light absorbing layer 300 while simultaneously or separately evaporating copper, indium, gallium, and selenium and a method for performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, and a Ga target. Thereafter, the metallic precursor layer is subject to the selenization process so that the $Cu(In, Ga)Se_2$ (CIGS) based light absorbing layer 300 is formed.

As an alternative, the sputter process and the selenization process using the copper target, the indium target, and the gallium target may be performed at the same time.

As another alternative, a CIS-based or CIG-based light absorbing layer 300 may be formed through a sputtering process or a selenization process by using only a copper target or an indium target, or by using a copper target and a gallium target.

As described above, the contact resistance layer 700 may be formed on the back electrode layer 200 where the bus bar 30 is not formed in the process of forming the light absorbing layer 300. For example, the contact resistance layer 700 may be formed by a reaction of the back electrode layer 200 of molybdenum (Mo) and the light absorbing layer 300 of selenium (Se), and the contact resistance layer 700 may include $MoSe_2$ or $MOS_2$.

As an alternative, the contact resistance layer 700 is not formed on the back electrode layer 200 where the bus bar 30 is formed. That is, the contact resistance layer 700 is not formed on an interface of the bus bar 30 and the back electrode layer 200. Accordingly, the bus bar 30 and the back electrode layer 200 may directly make contact with each other, and electron migration may be facilitated between the bus bar 30 and the back electrode layer 200. Thus, the photoelectric conversion efficiency of the solar cell apparatus according to the embodiment can be improved, and a bonding strength between the bus bar 30 and the back electrode layer 200 can be significantly improved.

Figure 7:
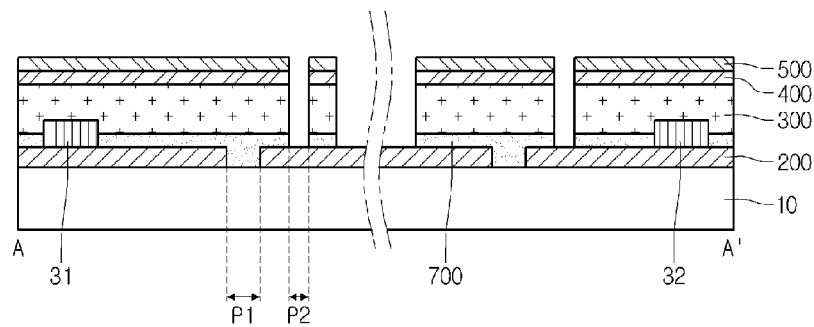

Referring to FIG. 7, the buffer layer 400 and the high-resistance buffer layer 500 are formed on the light absorbing layer 300. The buffer layer 400 may be formed by depositing cadmium sulfide on the light absorbing layer 300 through chemical bath deposition (CBD). Further, the high-resistance buffer layer 500 may be formed by depositing zinc oxide on the buffer layer 400 through a sputtering process.

Next, a second pattern P2 is formed in the light absorbing layer 400, the buffer layer 500, and the high-resistance buffer layer 500. The second contact pattern P2 may be formed through the light absorbing layer 400, the buffer layer 500, and the high-resistance buffer layer 500. The second pattern P2 may be formed through a mechanical method, and a width of the second pattern P2 may be approximately 80 µm to 200 µm, but the embodiment is not limited thereto.

Figure 8:
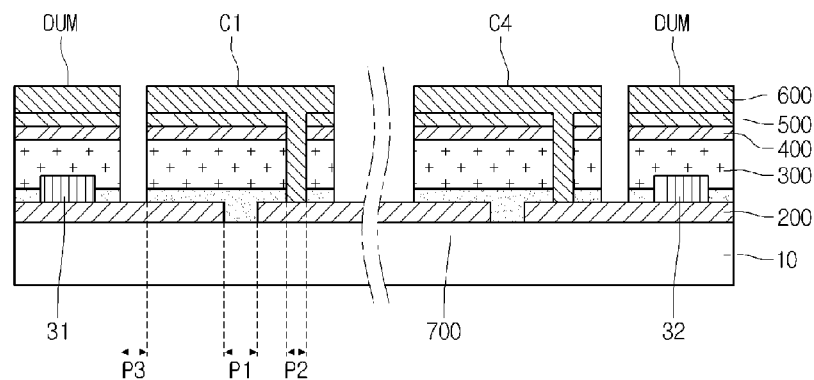

Next, as illustrated in FIG. 8, the front electrode layer 600 is formed by laminating a transparent conductive material on the high-resistance buffer layer 500. The front electrode layer 600 may be formed through sputtering or chemical vapor deposition. For example, the front electrode layer 600 may be fabricated through deposition using a ZnO target, reactive sputtering using a Zn target, and organic metal chemical deposition as an RF sputtering method.

Thereafter, a third pattern P3 is formed through the light absorbing layer 300, the buffer layer 400, the high-resistance buffer layer 500, and the front electrode layer 600. An upper surface of the back electrode pattern 200 is partially exposed by the third pattern P3.

In addition, the solar cells C1, C2, C3, . . . and the dummy DUM may be distinguished from each other by the third pattern P3. The third pattern P3 may be formed in a mechanical method or by irradiating a laser.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
a support substrate;
a vertical stack on the support substrate, the vertical stack comprising a back electrode layer, a light absorbing layer, and a front electrode layer deposited sequentially on the support substrate;
a plurality of solar cells, wherein each solar cell comprises a portion of the vertical stack such that each solar cell has a back electrode part, a light absorbing part, and a front electrode part;
dummy parts, each dummy part comprising a portion of the vertical stack such that each dummy part has a back electrode part, a light absorbing part, and a front electrode part;
wherein the plurality of solar cells are located between the dummy parts;
wherein, for each dummy part, the dummy part's front electrode part is not electrically connected to the back electrode part of the nearest of the plurality of solar cells;
a bus bar disposed within each dummy part between its back electrode part and its light absorbing part;
and a trench separating each dummy part from the nearest of the plurality of solar cells, wherein the trench passes through the front electrode layer and the light absorbing layer but not through the back electrode layer.

2. The solar cell apparatus of claim 1, further comprising a contact resistance layer disposed on the back electrode layer where the bus bar is not formed.

3. The solar cell apparatus of claim 2, wherein the contact resistance layer includes $MoSe_2$ or $MoS_2$.

4. The solar cell apparatus of claim 1, wherein the bus bar is disposed at an outer peripheral area of the support substrate.

5. The solar cell apparatus of claim 1, wherein the bus bars include a first bus bar connected to one of the solar cells, and a second bus bar connected to another one of the solar cells.

6. The solar cell apparatus of claim 1, wherein each bus bar includes one of silver (Ag), copper (Cu), gold (Au), aluminum (Al), tin (Sn), titanium (Ti), nickel (Ni), an alloy thereof, and a combination thereof.

7. The solar cell apparatus of claim 1, wherein each bus bar forms a bus line on the back electrode layer.

8. The solar cell apparatus of claim 2, wherein the light absorbing layer is formed on the back electrode layer, the bus bars, and the contact resistance layer.

* * * * *